(12) United States Patent
Liu (10) Patent No.: US 7,830,066 B2
(45) Date of Patent: Nov. 9, 2010

(54) MICROMECHANICAL DEVICE WITH PIEZOELECTRIC AND ELECTROSTATIC ACTUATION AND METHOD THEREFOR

(75) Inventor: Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 183 days.

(21) Appl. No.: 11/828,902

(22) Filed: Jul. 26, 2007

(65) Prior Publication Data

US 2009/0026880 A1 Jan. 29, 2009

(51) Int. Cl.
*H01L 41/08* (2006.01)
(52) U.S. Cl. .................. 310/309; 310/311; 310/330
(58) Field of Classification Search .......... 310/328, 310/330–332, 311
See application file for complete search history.

(56) References Cited

U.S. PATENT DOCUMENTS

| | | | |
|---|---|---|---|
| 3,247,711 A | | 4/1966 | Howatt |
| 3,952,215 A | * | 4/1976 | Sakitani ............... 310/328 |
| 4,422,002 A | * | 12/1983 | Binnig et al. ............ 310/328 |
| 4,939,401 A | | 7/1990 | Farrall |
| 5,004,555 A | | 4/1991 | Cheng et al. |
| 5,578,976 A | | 11/1996 | Yao |
| 5,638,946 A | | 6/1997 | Zavracky |
| 5,938,612 A | | 8/1999 | Kline-Schoder et al. |
| 6,046,659 A | | 4/2000 | Loo et al. |
| 6,060,336 A | | 5/2000 | Wan |
| 6,229,683 B1 | * | 5/2001 | Goodwin-Johansson .... 361/233 |
| 6,307,169 B1 | | 10/2001 | Sun et al. |
| 6,307,452 B1 | | 10/2001 | Sun |
| 6,384,353 B1 | | 5/2002 | Huang et al. |
| 6,479,920 B1 | | 11/2002 | Lal et al. |
| 6,483,056 B2 | * | 11/2002 | Hyman et al. ............ 200/181 |
| 6,504,118 B2 | | 1/2003 | Hyman et al. |
| 6,507,475 B1 | | 1/2003 | Sun |
| 6,549,570 B1 | | 4/2003 | Moden et al. |
| 6,706,548 B2 | | 3/2004 | Liu |

(Continued)

FOREIGN PATENT DOCUMENTS

WO 2005022575 A1 3/2005

OTHER PUBLICATIONS

Sood, R. et al.; "Piezoelectric Micro Power Generator for Energy Harvesting"; Department of Mechanical Engineering, Massachusetts Institute of Technology, Cambridge, MA.

(Continued)

*Primary Examiner*—Mark Budd
(74) *Attorney, Agent, or Firm*—Susan C. Hill; Ranjeev Singh (57) ABSTRACT

A MEMS device uses both piezoelectric actuation and electrostatic actuation and also provides enough electrostatic force to enable very low voltage operation. As the electrostatic actuation uses DC and the piezoelectric actuation uses high frequency, the structure of the device minimizes the coupling of the two actuator structures to reduce noise. In addition, for some embodiments, the location of the physical structures of the piezoelectric actuator and electrostatic actuator generates higher contact force with lower voltage. For some embodiments, the piezoelectric actuator and electrostatic actuator of the device are connected at the contact shorting bar or capacitor plate location. This makes the contact shorting bar or capacitor plate the focal point of the forces generated by all of the actuators, thereby increasing the switch contact force.

20 Claims, 3 Drawing Sheets

U.S. PATENT DOCUMENTS

| | | | |
|---|---|---|---|
| 6,713,942 | B2 | 3/2004 | Raman et al. |
| 6,731,492 | B2 * | 5/2004 | Goodwin-Johansson .... 361/233 |
| 6,744,264 | B2 | 6/2004 | Gogoi et al. |
| 6,794,101 | B2 | 9/2004 | Liu et al. |
| 6,864,767 | B2 * | 3/2005 | Streeter et al. ................. 335/78 |
| 6,872,902 | B2 | 3/2005 | Cohn et al. |
| 6,924,966 | B2 * | 8/2005 | Prophet ...................... 361/207 |
| 7,095,778 | B2 * | 8/2006 | Okubo et al. ............... 375/130 |
| 7,119,440 | B2 | 10/2006 | Huang |
| 7,141,989 | B1 | 11/2006 | Liu |
| 7,215,064 | B2 | 5/2007 | Mehta |
| 7,251,069 | B2 | 7/2007 | Kim et al. |
| 7,280,014 | B2 | 10/2007 | Potter |
| 7,301,254 | B1 | 11/2007 | Lal et al. |
| 7,343,655 | B2 * | 3/2008 | Mehta ........................ 29/25.35 |
| 7,345,404 | B2 * | 3/2008 | Klee et al. .................. 310/330 |
| 7,372,191 | B2 * | 5/2008 | Ohmori et al. .............. 310/330 |
| 2002/0098613 | A1 | 7/2002 | Loo et al. |
| 2003/0020173 | A1 | 1/2003 | Huff et al. |
| 2003/0127698 | A1 | 7/2003 | Lee |
| 2004/0036558 | A1 | 2/2004 | Allison et al. |
| 2004/0070400 | A1 | 4/2004 | Van Spengen |
| 2004/0094815 | A1 | 5/2004 | Park et al. |
| 2005/0127792 | A1 | 6/2005 | Mehta |
| 2005/0151444 | A1 | 7/2005 | Mehta |
| 2005/0168306 | A1 | 8/2005 | Cohn et al. |
| 2005/0237127 | A1 | 10/2005 | Van Delden |
| 2008/0042518 | A1 * | 2/2008 | Liu ............................ 310/319 |
| 2009/0085432 | A1 * | 4/2009 | Liu ............................ 310/317 |

OTHER PUBLICATIONS

Li, Y. et al.; "Vibration Control of a PZT Actuated Suspension Dual-Stage Servo System Using a PZT Sensor"; IEE Transactions on Magnetics; Mar. 2003; pp. 932-937; vol. 39, No. 2; IEEE.

"Piezoelectricity"; J. Webster (ed), Wiley Encyclopedia of Electrical and Electronics Engineering; 1999; 479-490; John Wiley & Sons, Inc.

International Search Report and Written Opinion mailed October 24, 2007 in PCT Application PCT/US07/61336 corresponding to Application SC15084ZP.

Office Action mailed Jun. 6, 2008 in U.S. Appl. No. 11/465,311.
Office Action mailed Jul. 9, 2008 in U.S. Appl. No. 11/465,319.
Office Action mailed Dec. 10, 2008 in U.S. Appl. No. 11/465,319.
Notice of Allowance mailed May 4, 2009 in U.S. Appl. No. 11/465,319.
Office Action mailed Nov. 21, 2008 in U.S. Appl. No. 11/401,797.
Office Action mailed Jun. 8, 2009 in U.S. Appl. No. 11/401,797.
Office Action mailed Oct. 26, 2009 in U.S. Appl. No. 11/401,797.
Office Action mailed Feb. 25, 2010 in U.S. Appl. No. 11/401,797.
Office Action mailed Jan. 7, 2008 in U.S. Appl. No. 11/363,791.
Office Action mailed Jun. 2, 2008 in U.S. Appl. No. 11/363,791.
Notice of Allowance mailed Mar. 4, 2009 in U.S. Appl. No. 11/363,791.

* cited by examiner

MICROMECHANICAL DEVICE WITH PIEZOELECTRIC AND ELECTROSTATIC ACTUATION AND METHOD THEREFOR

CROSS-REFERENCE TO RELATED APPLICATION(S)

This application is related to U.S. patent application Ser. No. 11/465,319, filed on Aug. 17, 2006, entitled "CONTROL AND TESTING OF A MICRO ELECTROMECHANICAL SWITCH HAVING A PIEZO ELEMENT", and assigned to the current assignee hereof.

This application is related to U.S. patent application Ser. No. 11/465,311, filed on Aug. 17, 2006, entitled "CONTROL AND TESTING OF A MICRO ELECTROMECHANICAL SWITCH", and assigned to the current assignee hereof.

This application is related to U.S. patent application Ser. No. 11/363,791, filed on Feb. 28, 2006, entitled "PIEZOELECTRIC MEMS SWITCHES AND METHODS OF MAKING", and assigned to the current assignee hereof.

This application is related to U.S. patent application Ser. No. 11/401,797, filed on Apr. 10, 2006, entitled "METHODS AND APPARATUS FOR A PACKAGED MEMS SWITCH", and assigned to the current assignee hereof.

BACKGROUND

1. Field

This disclosure relates generally to micromechanical devices, and more specifically, to a micromechanical device with piezoelectric and electrostatic actuation.

2. Related Art

Micro electrical mechanical systems (MEMS) are a known class of devices typically made by semiconductor processing techniques in semiconductor materials. Examples of such MEMS may be used in switches where an electrical contact needs to be made to a signal line. For example, a MEMS switch may be used when two parts of a radio frequency or microwave system need to be controllably connected and disconnected. In such a system, the MEMS switch may operate by mechanically moving a switch contact on a moveable arm or beam onto and away from a fixed stationary contact pad. Electrostatic actuation is one technique used in MEMS switches. Such actuation provides a force between two conducting objects. Transverse piezoelectric actuation of an arm or beam is another techniques used in MEMS switches.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Conventional electrostatic MEMS switch and capacitor devices require an actuation voltage in the range of 30-100 volts. Most semiconductor devices now operate using a power supply voltage (VDD) of 3 volts or less. The need for a high actuation voltage poses a problem from both a cost standpoint and a physical size standpoint, as an extra charge pump is needed to boost the voltage to 30-100 volts from the power supply voltage of approximately 3 volts or less (e.g. provided by a battery). The power required by this extra charge pump may also be a drawback in some systems (e.g. a battery powered system).

Piezoelectric actuation uses much lower voltages (3-10 volts), but due to constraints in the properties of the materials used to form the piezoelectric structures, the generated contact force at the "switch close" state is low (for example, less than 5 micro Newtons), which is not good for contact resistance and reliability. A piezoelectric actuator has a higher net force at initial "switch open" state (zero deflection) and a lower net force at the "switch close" state. On the other hand, electrostatic actuators generate lower force at the initial "switch open" state and higher force at the "switch close" state. A carefully arranged combination of piezoelectric actuation and electrostatic actuation can take advantage of both mechanisms to produce a MEMS device with the desired features regarding operating behavior, low voltage operation, reliability, cost, and size.

In some embodiments, the MEMS device described herein uses both piezoelectric actuation and electrostatic actuation and also provides enough electrostatic force to enable very low voltage operation (such as, for example, in one embodiment 3-5 volts, and in alternate embodiments, even less than 3 volts). In addition, in some embodiments, the MEMS device described herein minimizes the coupling of actuation signal (DC or pulsed DC) and switch high frequency signal (e.g. radio frequencies, microwave frequencies, etc.), and it is advantageous to use structures that minimize the coupling and thus the crosstalk or noise produced by the actuation signal to the switched signals.

In some embodiments, the location and orientation of the various portions of the piezoelectric actuator and electrostatic actuator significantly affect the behavior of the overall MEMS switch. In some embodiments, the separation of the physical structures of the piezoelectric actuator and electrostatic actuator allows more flexibility and optimization of the overall device structure. In some embodiments, the separation of the physical structures of the piezoelectric actuator and electrostatic actuator generates higher contact force with lower voltage.

In addition, for some embodiments, the piezoelectric actuator and electrostatic actuator of the device are connected at the contact shorting bar (or capacitor plate) location. This makes the contact shorting bar (or capacitor plate) the focal point of the forces generated by all of the actuators, thereby increasing the switch contact force.

In some embodiments, a more symmetrical layout design of the electrostatic actuator with respect to the contact shorting bar (or capacitor plate) may result in more efficient transfer or uniform application of the force generated by the actuators on the contact shorting bar or capacitor plate. It may also eliminate the disadvantages of the second pull-in effect associated with some simple cantilever actuator designs.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
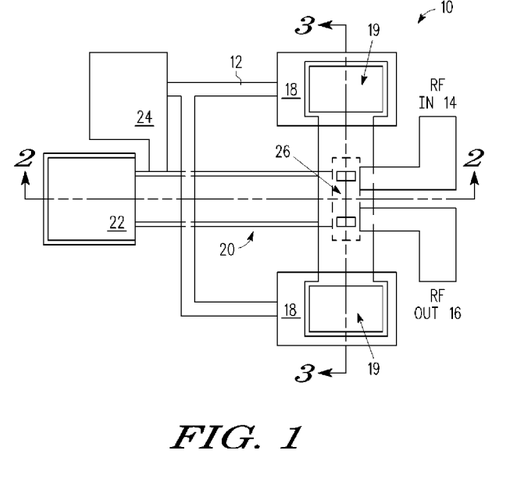
FIG. 1 illustrates, in a top plan view, a MEMS device in accordance with one embodiment.

FIG. 1 illustrates, in a top plan view, a MEMS device 10 in accordance with one embodiment. Device 10 may operate as a switch which uses both piezoelectric actuation and electrostatic actuation. A radio frequency signal RF IN is provided as an input to device 10. A radio frequency signal RF OUT is provided as an output from device 10. Alternate embodiments may use any desired and appropriate frequencies of input and output signals; radio frequency signals are just one possibility. Element 18 provides a first electrostatic plate and element 19 provides a second electrostatic plate. Together, electrostatic plates 18 and 19 may function as an electrostatic actuator. In one embodiment, moveable structure 20 (see FIG. 2) comprises a piezoelectric element that generates a mechanical stress and produces movement of structure 20 as a result of a voltage differential being applied at pads or nodes 22 and 24. In one embodiment, a first power supply voltage (approximately ground) is applied to pad 22, while a second power supply voltage (approximately VDD) is applied to pad 24. Note that for some embodiments, the second power supply voltage (approximately VDD) may be the voltage that is provided by a power source (e.g. a battery) and that is used to power one or more integrated circuits in a system that utilizes MEMS device 10. Note that by using this second power supply voltage (approximately VDD), a charge pump is not required by device 10 to increase the voltage over the system power supply voltage VDD.

In the illustrated embodiment, the electrostatic actuator is divided into two portions. Alternate embodiments may use only a single portion, or may use any number of portions. In FIG. 1, the electrostatic actuator comprises two electrodes or electrode portions 18 that are coupled to a conductor 12. In the illustrated embodiment, conductor 12 is used to electrically couple the pad 24 to one or more electrostatic electrodes 18 for providing the second power supply voltage (approximately VDD). In one embodiment, conductor 12 is a high resistance conductor. Electrostatic electrodes 18 operate as one electrode of the electrostatic actuator. In the illustrated embodiment, the electrostatic actuator also comprises two electrodes or electrode portions 19 that are coupled to a pad 22 for receiving the first power supply voltage (approximately ground or VSS). Electrostatic electrodes 19 operate as a second electrode of the electrostatic actuator. Again device 10 may comprise any number of electrostatic electrode portions 18 and any number of electrostatic electrode portions 19.

Figure 2:
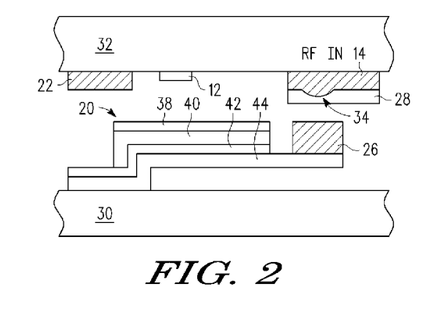
FIG. 2 illustrates, in a cross-sectional view taken along the line 2-2, a portion of the device of FIG. 1 in accordance with one embodiment.

Referring to FIG. 2, in the illustrated embodiment structure 20 is any appropriate moveable portion or structure. Although structure 20 has been illustrated as a rectangular beam or cantilever, any appropriate shape or orientation for structure 20 may be used. In the illustrated embodiment, structure 20 has been illustrated as comprising a support layer 44, comprising a lower piezoelectric actuation electrode 42 overlying the support layer 44, comprising a piezoelectric material layer 40 overlying the lower piezoelectric actuation electrode 42, and comprising an upper piezoelectric actuation electrode 38 overlying the piezoelectric material layer 40. Piezoelectric actuation electrodes 38 and 42 may be comprised of any desired and appropriate conducting material or materials. Piezoelectric layer 40 may be comprised of any desired and appropriate material or materials. In one embodiment, support layer 44 comprises a dielectric layer. In alternate embodiments, support layer 44 may be comprised of any desired and appropriate support material or materials.

In the embodiment illustrated in FIG. 2, an electrode 26 functions as either a shorting bar 26 or as a capacitor plate or electrode 26. If element 26 comprises a conductive material (e.g. metal), if conductor 14 carrying the RF IN signal comprises a conductive material (e.g. metal), and if there is no layer 28, then element 26 acts as a shorting bar to short conductor 14 and element 26. In one embodiment, a protrusion or bump 34 may be formed on conductor 14 to improve the metal to metal contact between conductor 14 and element 26. However, for embodiments that use element 26 as a capacitor electrode, a bump 34 may not be used. If element 26 comprises a conductive material (e.g. metal), if conductor 14 carrying the RF IN signal comprises a conductive material (e.g. metal), and if there is a dielectric layer 28 interposed between element 26 and conductor 14, then element 26 and element 14 act as capacitor plates or electrodes to form a capacitor structure 14, 28, 26. In one embodiment, dielectric layer 28 may comprise any one or more layers and together function as a dielectric layer between two conducting plates 14, 26 of a capacitor structure 14, 28, 26.

Figure 3:
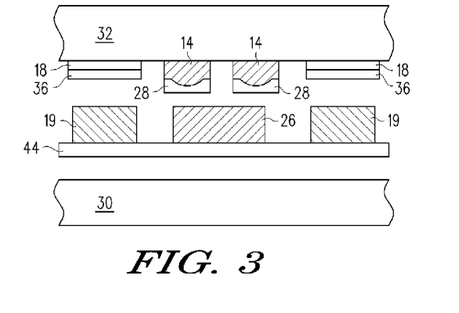
FIG. 3 illustrates, in a cross-sectional view taken along the line 3-3, a portion of the device of FIG. 1 in accordance with one embodiment.

Referring to FIG. 3 as well as to FIG. 2, in the illustrated embodiment structure 20 is formed on a substrate 30; element 26 and one or more electrostatic electrodes 19 are formed on support element 44; and pads 22 and 24, conductor 12, conductors 14 and 16, and electrostatic electrodes 18 are formed on a substrate 32. Substrates 30 and 32 may comprise a semiconductor material, however alternate embodiments may comprise one or more layers of any desired and appropriate material or materials.

Referring to FIG. 3, in the illustrated embodiment, a dielectric layer 36 is disposed adjacent to the electrostatic layer 18. In the illustrated embodiment, layer 36 may be used to prevent direct contact and electrical shorting between electrostatic electrodes 18 and 19.

Referring to FIGS. 1-3, when actuation voltage is applied (e.g. VDD to pad 24 and VSS to pad 22), the piezoelectric actuator (formed by 38, 40, 42) generate the primary force to move the movable structure 20 close to the fixed electrostatic electrode 18 and RF conductors 14 and 16. Then the electrostatic actuator generates the required extra force to improve the contact performance. Note that alternate embodiments may use any number of electrostatic actuators or actuator portions. Also, although the illustrated embodiment uses one piezoelectric actuator, alternate embodiments may use any number of piezoelectric actuators or actuator portions. Note that the embodiment illustrated in FIGS. 1-3 provides the contact point(s) as the focus point(s) for the forces generated by both the piezoelectric actuator and the electrostatic actuator. In the illustrated embodiment, the majority of the contact force is generated by electrostatic actuation, making it less dependant on piezoelectric material stability. For some embodiments, this may be an important advantage.

Note that in the embodiment illustrated in FIGS. 1-3, the electrostatic actuators or actuator portions (formed by 18 and 19) are located on the periphery of device 10, while the piezoelectric actuator (formed by 38, 40, and 42) is more centrally located in the middle between the electrostatic actuators.

Figure 4:
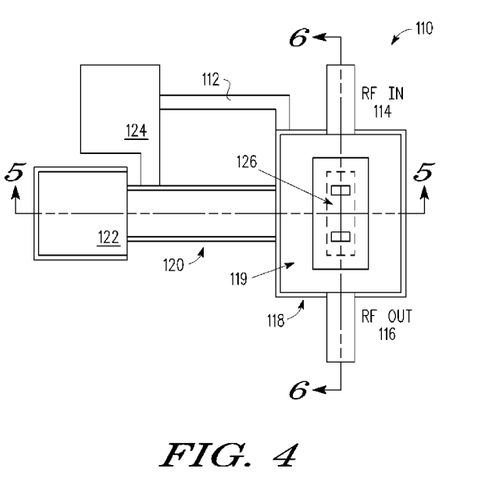
FIG. 4 illustrates, in a top plan view, a MEMS device in accordance with another embodiment.
Figure 5:
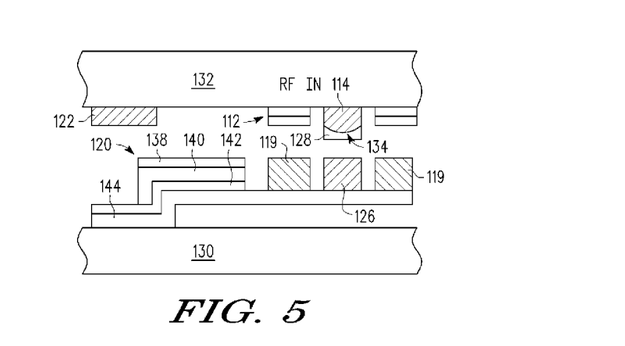
FIG. 5 illustrates, in a cross-sectional view taken along the line 5-5, a portion of the device of FIG. 4 in accordance with another embodiment.
Figure 6:
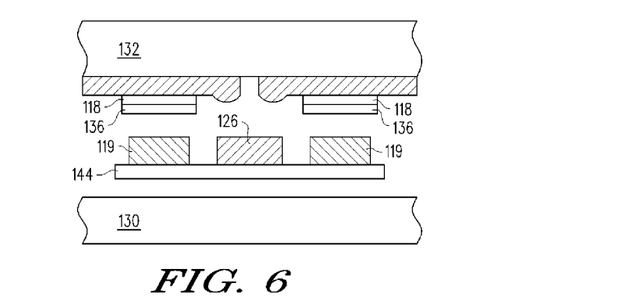
FIG. 6 illustrates, in a cross-sectional view taken along the line 6-6, a portion of the device of FIG. 4 in accordance with another embodiment.

FIGS. 4-6 illustrate an alternate embodiment in which the RF IN conductor 14 and the RF OUT conductor 16 are now aligned in a straight line. By aligning the RF IN conductor 14 and the RF OUT conductor 16 in a straight line, less loss may result in the RF signal on these conductors. In addition, the embodiment illustrated in FIGS. 4-6 locates both the piezoelectric actuator and the electrostatic actuator together in a central location.

FIG. 4 illustrates, in a top plan view, a MEMS device 110 in accordance with one embodiment. Device 110 may operate as a switch which uses both piezoelectric actuation and electrostatic actuation. A radio frequency signal RF IN is provided as an input to device 110. A radio frequency signal RF OUT is provided as an output from device 110. Alternate embodiments may use any desired and appropriate frequencies of input and output signals; radio frequency signals are just one possibility. Element 118 provides a first electrostatic plate and element 119 provides a second electrostatic plate. Together, electrostatic plates 118 and 119 may function as an electrostatic actuator. In one embodiment, moveable structure 120 (see FIG. 5) comprises a piezoelectric element that generates a mechanical stress and produces movement of structure 120 as a result of a voltage differential being applied at pads or nodes 122 and 124. In one embodiment, a first power supply voltage (approximately ground) is applied to pad 122, while a second power supply voltage (approximately VDD) is applied to pad 124. Note that for some embodiments, the second power supply voltage (approximately VDD) may be the voltage that is provided by a power source (e.g. a battery) and that is used to power one or more integrated circuits in a system that utilizes MEMS device 110. Note that by using this second power supply voltage (approximately VDD), a charge pump is not required by device 110 to increase the voltage over the system power supply voltage VDD.

In the illustrated embodiment, the electrostatic actuator is not divided into two portions. Alternate embodiments may use only a single portion, or may use any number of portions. In FIG. 4, the electrostatic actuator comprises an electrode 118 that is coupled to a conductor 112. In the illustrated embodiment, conductor 112 is used to electrically couple the pad 124 to one or more electrostatic electrodes 118 for providing the second power supply voltage (approximately VDD). In one embodiment, conductor 112 is a high resistance conductor. Electrostatic electrode 118 operates as one electrode of the electrostatic actuator. In the illustrated embodiment, the electrostatic actuator also comprises an electrode 119 that is coupled to a pad 122 for receiving the first power supply voltage (approximately ground or VSS). Electrostatic electrode 119 operate as a second electrode of the electrostatic actuator. Again device 110 may comprise any number of electrostatic electrode portions 118 and any number of electrostatic electrode portions 119.

Referring to FIG. 5, in the illustrated embodiment structure 120 is any appropriate moveable portion or structure. Although structure 120 has been illustrated as a rectangular beam or cantilever, any appropriate shape or orientation for structure 120 may be used. In the illustrated embodiment, structure 120 has been illustrated as comprising a support layer 144, comprising a lower piezoelectric actuation electrode 142 overlying the support layer 144, comprising a piezoelectric material layer 140 overlying the lower piezoelectric actuation electrode 142, and comprising an upper piezoelectric actuation electrode 138 overlying the piezoelectric material layer 140. Piezoelectric actuation electrodes 138 and 142 may be comprised of any desired and appropriate conducting material or materials. Piezoelectric layer 140 may be comprised of any desired and appropriate material or materials. In one embodiment, support layer 144 comprises a dielectric layer. In alternate embodiments, support layer 144 may be comprised of any desired and appropriate support material or materials.

In the embodiment illustrated in FIG. 5, an electrode 126 functions as either a shorting bar 126 or as a capacitor plate or electrode 126. If element 126 comprises a conductive material (e.g. metal), if conductor 114 carrying the RF IN signal comprises a conductive material (e.g. metal), and if there is no layer 128, then element 126 acts as a shorting bar to short conductor 114 and element 126. In one embodiment, a protrusion or bump 134 may be formed on conductor 114 to improve the metal to metal contact between conductor 114 and element 126. However, for embodiments that use element 126 as a capacitor electrode, a bump 134 may not be used. If element 126 comprises a conductive material (e.g. metal), if conductor 114 carrying the RF IN signal comprises a conductive material (e.g. metal), and if there is a dielectric layer 128 interposed between element 126 and conductor 114, then element 126 and element 114 act as capacitor plates or electrodes to form a capacitor structure 114, 128, 126. In one embodiment, dielectric layer 128 may comprise any one or more layers and together function as a dielectric layer between two conducting plates 114, 126 of a capacitor structure 114, 128, 126.

Referring to FIG. 6 as well as to FIG. 5, in the illustrated embodiment structure 120 is formed on a substrate 130; element 126 and one or more electrostatic electrodes 119 are formed on support element 144; and pads 122 and 124, conductor 112, conductors 114 and 116, and electrostatic electrodes 118 are formed on a substrate 132. Substrates 130 and 132 may comprise a semiconductor material, however alternate embodiments may comprise one or more layers of any desired and appropriate material or materials.

Referring to FIG. 6, in the illustrated embodiment, a dielectric layer 136 is disposed adjacent to the electrostatic layer 118. In the illustrated embodiment, layer 136 may be used to prevent direct contact and electrical shorting between electrostatic electrodes 118 and 119.

Referring to FIGS. 4-6, when actuation voltage is applied (e.g. VDD to pad 24 and VSS to pad 22), the piezoelectric actuator (formed by 138, 140, 142) generate the primary force to move the movable structure 120 close to the fixed electrostatic electrode 118 and RF conductors 114 and 116. Then the electrostatic actuator generates the required extra force to improve the contact performance. Note that alternate embodiments may use any number of electrostatic actuators or actuator portions. Also, although the illustrated embodiment uses one piezoelectric actuator, alternate embodiments may use any number of piezoelectric actuators or actuator portions. Note that the embodiment illustrated in FIGS. 4-6 provides the contact point(s) as the focus point(s) for the forces generated by both the piezoelectric actuator and the electrostatic actuator. In the illustrated embodiment, the majority of the contact force is generated by electrostatic actuation, making it less dependant on piezoelectric material stability. For some embodiments, this may be an important advantage.

Figure 7:
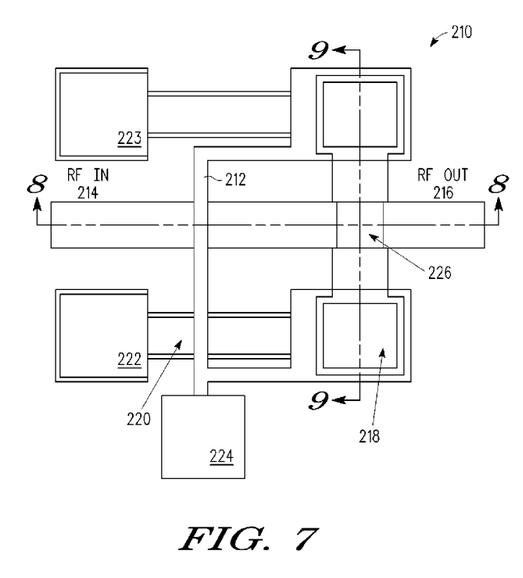
FIG. 7 illustrates, in a top plan view, a MEMS device in accordance with an alternate embodiment.
Figure 8:
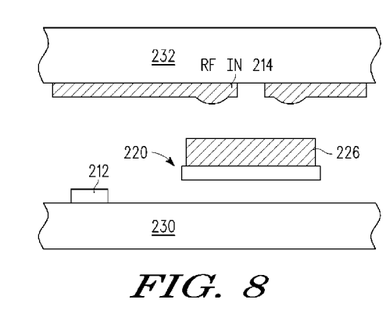
FIG. 8 illustrates, in a cross-sectional view taken along the line 8-8, a portion of the device of FIG. 7 in accordance with an alternate embodiment.
Figure 9:
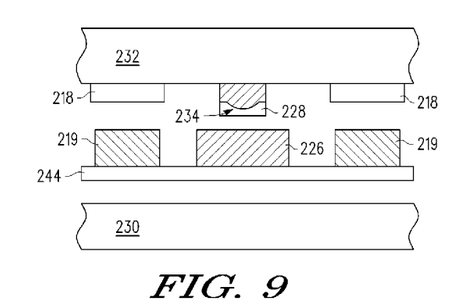
FIG. 9 illustrates, in a cross-sectional view taken along the line 9-9, a portion of the device of FIG. 7 in accordance with an alternate embodiment.

FIGS. 7-9 illustrate an alternate embodiment in which the RF IN conductor 14 and the RF OUT conductor 16 are still aligned in a straight line, but are now placed perpendicular to their locations in the top plan view of FIG. 4 and are more centrally located. Again, by aligning the RF IN conductor 14 and the RF OUT conductor 16 in a straight line, less loss may result in the RF signal on these conductors. In addition, the embodiment illustrated in FIGS. 7-9 splits the piezoelectric actuator into two portions and splits the electrostatic actuator into two portions and locates all of these actuator portions on the outside or periphery compared to the location of the RF conductors 14 and 16. The physical distance between the RF conductors 14, 16 and the actuator structures may have the advantage of producing less coupling between the DC signals for powering the actuators and the RF signals being switched. Less coupling between the DC and RF signals may result in less noise being generated on the RF OUT signal 16 due to device 10.

FIG. 7 illustrates, in a top plan view, a MEMS device 210 in accordance with one embodiment. Device 210 may operate as a switch which uses both piezoelectric actuation and electrostatic actuation. A radio frequency signal RF IN is provided as an input to device 210. A radio frequency signal RF OUT is provided as an output from device 210. Alternate embodiments may use any desired and appropriate frequencies of input and output signals; radio frequency signals are just one possibility. Element 218 provides a first electrostatic plate and element 219 provides a second electrostatic plate. Together, electrostatic plates 218 and 219 may function as an electrostatic actuator. In one embodiment, moveable structure 220 (see FIG. 8) comprises a piezoelectric element that generates a mechanical stress and produces movement of structure 220 as a result of a voltage differential being applied at pads or nodes 222 and 224. In one embodiment, a first power supply voltage (approximately ground) is applied to pad 222, while a second power supply voltage (approximately VDD) is applied to pad 224. Note that for some embodiments, the second power supply voltage (approximately VDD) may be the voltage that is provided by a power source (e.g. a battery) and that is used to power one or more integrated circuits in a system that utilizes MEMS device 210. Note that by using this second power supply voltage (approximately VDD), a charge pump is not required by device 210 to increase the voltage over the system power supply voltage VDD.

In the illustrated embodiment, the electrostatic actuator is divided into two portions. Alternate embodiments may use only a single portion, or may use any number of portions. In FIG. 7, the electrostatic actuator comprises two electrodes or electrode portions 218 that are coupled to a conductor 212. In the illustrated embodiment, conductor 212 is used to electrically couple the pad 224 to one or more electrostatic electrodes 218 for providing the second power supply voltage (approximately VDD). In one embodiment, conductor 212 is a high resistance conductor. Electrostatic electrodes 218 operate as one electrode of the electrostatic actuator. In the illustrated embodiment, the electrostatic actuator also comprises two electrodes or electrode portions 219 that are coupled to a pad 222 for receiving the first power supply voltage (approximately ground or VSS). Electrostatic electrodes 219 operate as a second electrode of the electrostatic actuator. Again device 210 may comprise any number of electrostatic electrode portions 218 and any number of electrostatic electrode portions 219.

Referring to FIG. 8, in the illustrated embodiment structure 220 is any appropriate moveable portion or structure. Although structure 220 has been illustrated as a rectangular beam or cantilever, any appropriate shape or orientation for structure 220 may be used. In the illustrated embodiment, structure 220 has been illustrated as comprising a support layer 244, comprising a lower piezoelectric actuation electrode 242 overlying the support layer 244, comprising a piezoelectric material layer 240 overlying the lower piezoelectric actuation electrode 242, and comprising an upper piezoelectric actuation electrode 238 overlying the piezoelectric material layer 240. Piezoelectric actuation electrodes 238 and 242 may be comprised of any desired and appropriate conducting material or materials. Piezoelectric layer 240 may be comprised of any desired and appropriate material or materials. In one embodiment, support layer 244 comprises a dielectric layer. In alternate embodiments, support layer 244 may be comprised of any desired and appropriate support material or materials.

In the embodiment illustrated in FIG. 8, an electrode 226 functions as either a shorting bar 226 or as a capacitor plate or electrode 226. If element 226 comprises a conductive material (e.g. metal), if conductor 214 carrying the RF IN signal comprises a conductive material (e.g. metal), and if there is no layer 228, then element 226 acts as a shorting bar to short conductor 214 and element 226. In one embodiment, a protrusion or bump 234 may be formed on conductor 214 to improve the metal to metal contact between conductor 214 and element 226. However, for embodiments that use element 226 as a capacitor electrode, a bump 234 may not be used. If element 226 comprises a conductive material (e.g. metal), if conductor 214 carrying the RF IN signal comprises a conductive material (e.g. metal), and if there is a dielectric layer 228 interposed between element 226 and conductor 214, then element 226 and element 214 act as capacitor plates or electrodes to form a capacitor structure 214, 228, 226. In one embodiment, dielectric layer 228 may comprise any one or more layers and together function as a dielectric layer between two conducting plates 214, 226 of a capacitor structure 214, 228, 226.

Referring to FIG. 9 as well as to FIG. 8, in the illustrated embodiment structure 220 is formed on a substrate 230; element 226 and one or more electrostatic electrodes 219 are formed on support element 244; and pads 222 and 224, conductor 212, conductors 214 and 216, and electrostatic electrodes 218 are formed on a substrate 232. Substrates 230 and 232 may comprise a semiconductor material, however alternate embodiments may comprise one or more layers of any desired and appropriate material or materials.

Referring to FIG. 9, in the illustrated embodiment, a dielectric layer 236 is disposed adjacent to the electrostatic layer 218. In the illustrated embodiment, layer 236 may be used to prevent direct contact and electrical shorting between electrostatic electrodes 218 and 219.

Referring to FIGS. 7-9, when actuation voltage is applied (e.g. VDD to pad 224 and VSS to pad 222), the piezoelectric actuator (formed by 238, 240, 242) generate the primary force to move the movable structure 220 close to the fixed electrostatic electrode 218 and RF conductors 214 and 216. Then the electrostatic actuator generates the required extra force to improve the contact performance. Note that alternate embodiments may use any number of electrostatic actuators or actuator portions. Also, although the illustrated embodiment uses one piezoelectric actuator, alternate embodiments may use any number of piezoelectric actuators or actuator portions. Note that the embodiment illustrated in FIGS. 7-9 provides the contact point(s) as the focus point(s) for the forces generated by both the piezoelectric actuator and the electrostatic actuator. In the illustrated embodiment, the majority of the contact force is generated by electrostatic actuation, making it less dependant on piezoelectric material stability. For some embodiments, this may be an important advantage.

In some embodiments, the use of piezoelectric actuation is for reducing the actuation voltage that is necessary to deflect the mechanical structure, while the use of electrostatic actuation is for providing more contact force. Although the actual actuation voltage for some embodiments may be in the range of 3-5 volts due to the voltages available in the overall system, alternate embodiments may use an actuation voltage range which includes higher voltages and/or lower voltages. A higher actuation voltage (piezoelectric or electrostatic) may provide even larger deflection and contact force, which may be desirable for some embodiments. A lower activation voltage may be required for some embodiments (e.g. battery powered embodiments where power savings is important). As an example, some embodiments may use an activation voltage in the range of 1-10 volts. As most prior art electrostatic actuators require an actuation voltage in the range of 30-100 volts, a device that uses a lower activation voltage may be very advantageous for systems that do not have voltages in the 30-100 volts range readily available or that are intended for low power applications.

Some electronic systems that use these devices 10, 110, and/or 210 use a primary power supply voltage (e.g. from a battery) that is in the range of 3-5 volts and no other circuitry is available to increase the power supply voltage. In such cases, devices 10, 110, and/or 210 can use the primary power supply voltage that is in the range of 3-5 volts as the actuation voltages. However, some electronic systems which use one or more of devices 10, 110, and/or 210 use one or more local DC-DC converter circuits to increase the local available voltage to 5-10 volts for improvement of other circuit/device performances. In embodiments that already have a local DC-DC converter, devices 10, 110, and/or 210 can utilize this increased voltage available from the system to use higher actuation voltages, when available.

Note also that devices 10, 110, and/or 210 use a combination of piezoelectric actuation with electrostatic actuation. However, the piezoelectric actuator and electrostatic actuator in each of devices 10, 110, and 210 are physically layed out in such a manner that the piezoelectric actuator and electrostatic actuator are separated both vertically and horizontally (although still connected), allowing independent optimization of the two actuators. Note that the piezoelectric actuator and the electrostatic actuator in each of devices 10, 110, and 210 do not have a physically shared electrode and are not vertically stacked together. As a result, in each of devices 10, 110, and 210, there is a much smaller gap between the electrostatic electrodes after the piezoelectric actuator is actuated, resulting in a higher contact force and the ability to use a lower electrostatic actuation voltage.

By now it should be appreciated that there has been provided an improved device 10, 110, 210 that performs a switching function using both piezoelectric actuation and electrostatic actuation and also provides enough contact force to enable very low voltage operation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a wide variety of structures different from those illustrated in FIGS. 1-9 may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A method, comprising:
   providing a device having both piezoelectric actuation and electrostatic actuation which operates using a piezoelectric actuation voltage less than or equal to ten volts and which operates using an electrostatic actuation voltage less than or equal to ten volts.

2. A method as in statement 1, wherein the piezoelectric actuation voltage is less than or equal to five volts and the electrostatic actuation voltage is less than or equal to five volts.

3. A method as in statement 1, wherein the piezoelectric actuation voltage is less than or equal to three volts and the electrostatic actuation voltage is less than or equal to three volts.

4. A method as in statement 1, wherein the piezoelectric actuation voltage is approximately equal to the electrostatic actuation voltage.

5. A method as in statement 1, wherein the piezoelectric actuation voltage is approximately equal to a power supply voltage, wherein the electrostatic actuation voltage is approximately equal to the power supply voltage, and wherein the power supply voltage is used to power circuitry on an integrated circuit.

6. A method as in statement 1, wherein no charge pump is used to provide the piezoelectric actuation voltage, and wherein no charge pump is used to provide the electrostatic actuation voltage.

7. A method as in statement 1, wherein the piezoelectric actuation is provided by a piezoelectric actuator, the electrostatic actuation is provided by an electrostatic actuator having at least one of a contact shorting bar or an electrode, and wherein the piezoelectric actuator and the electrostatic actuator are coupled at the at least one of the contact shorting bar or the electrode.

8. A method as in statement 7, wherein the electrode is a capacitor plate.

9. A method as in statement 1, wherein the electrostatic actuation is provided by an electrostatic actuator, wherein the electrostatic actuator comprises at least one of a contact shorting bar or an electrode, and wherein the electrostatic actuator is approximately symmetrical with regard to the at least one of the contact shorting bar or the electrode.

10. A method as in statement 1, wherein the device is used to switch a radio frequency signal.

11. A method as in statement 1, wherein the device is used in a system handling high frequency signal switching.

12. A method, comprising:
providing a system having a power supply voltage less than or equal to ten volts;
providing a piezoelectric actuator which operates using a piezoelectric actuation voltage equal to the power supply voltage of less than or equal to ten volts; and
providing an electrostatic actuator which operates using an electrostatic actuation voltage equal to the power supply voltage of less than or equal to ten volts, the electrostatic actuator having at least one of a contact shorting bar or a capacitor electrode,
wherein the piezoelectric actuator and the electrostatic actuator are coupled at the at least one of the contact shorting bar or the capacitor electrode.

13. A method as in statement 12, wherein no charge pump is used to provide the piezoelectric actuation voltage, and wherein no charge pump is used to provide the electrostatic actuation voltage.

14. A method as in statement 12, wherein the piezoelectric actuation voltage is less than or equal to five volts and the electrostatic actuation voltage is less than or equal to five volts.

15. A method as in statement 12, wherein the piezoelectric actuation voltage is less than or equal to three volts and the electrostatic actuation voltage is less than or equal to three volts.

16. A device, comprising:
a piezoelectric actuator,
wherein the piezoelectric actuator has an actuation voltage less than ten volts; and
an electrostatic actuator,
wherein the electrostatic actuator has an actuation voltage less than ten volts.

17. A device as in statement 16, wherein the electrostatic actuator comprises a contact shorting bar, and wherein the piezoelectric actuator is coupled to the electrostatic actuator at the contact shorting bar.

18. A device as in statement 16, wherein the electrostatic actuator comprises a capacitor electrode, and wherein the piezoelectric actuator is coupled to the electrostatic actuator at the capacitor electrode.

19. A device as in statement 16, wherein the electrostatic actuator comprises a contact shorting bar, a first electrostatic actuator portion, and a second electrostatic actuator portion, and wherein a layout of the first electrostatic actuator portion and a layout of the second electrostatic actuator portion are approximately symmetrical with respect to the contact shorting bar.

20. A device as in statement 16, wherein the electrostatic actuator comprises capacitor electrode, a first electrostatic actuator portion, and a second electrostatic actuator portion, and wherein a layout of the first electrostatic actuator portion and a layout of the second electrostatic actuator portion are approximately symmetrical with respect to the capacitor electrode.

What is claimed is:

1. A device for coupling an input signal to an output signal, comprising:
a piezoelectric actuator comprising a support layer, a first piezoelectric electrode overlying the support layer, a piezoelectric material layer overlying the first piezoelectric electrode layer, and a second piezoelectric electrode overlying the piezoelectric material layer; and
an electrostatic actuator comprising a contact shorting bar formed over the support layer, wherein the contact shorting bar is coupled to receive the input signal, a first electrostatic actuator portion overlying the support layer and a second electrostatic actuator portion overlying the support layer, wherein the piezoelectric actuator is coupled to the electrostatic actuator at the contact shorting bar, and wherein the first electrostatic portion comprises a first electrode and a second electrode and the second electrostatic portion comprises a third electrode and a fourth electrode, and wherein each of the first electrode and the third electrode is coupled to a power supply voltage and wherein each of the second electrode and the fourth electrode is coupled to a ground voltage, and wherein the piezoelectric actuator and the electrostatic actuator are arranged in a manner that they are separated physically from each other both in a first direction and a second direction that is perpendicular to the first direction.

2. The device of claim 1, wherein the contact shorting bar is configured as a capacitor electrode.

3. The device of claim 1, wherein a layout of the first electrostatic actuator portion and a layout of the second electrostatic actuator portion are approximately symmetrical with respect to the contact shorting bar.

4. The device of claim 2, and wherein a layout of the first electrostatic actuator portion and a layout of the second electrostatic actuator portion are approximately symmetrical with respect to the capacitor electrode.

5. The device of claim 1 further comprising a first voltage pad and a second voltage pad, wherein an actuation voltage is coupled to the piezoelectric actuator via the first voltage pad and the second voltage pad.

6. The device of claim 5, wherein the input signal received by the device is coupled to the output signal in response to the actuation voltage causing a movement of the piezoelectric actuator.

7. A device for coupling an input signal received via a first conductor to an output signal received via a second conductor, comprising:
a piezoelectric actuator comprising a support layer, a first piezoelectric electrode overlying the support layer, a piezoelectric material layer overlying the first piezoelectric electrode layer, and a second piezoelectric electrode overlying the piezoelectric material layer; and
an electrostatic actuator comprising a contact shorting bar formed over the support layer, wherein the contact shorting bar is coupled to receive the input signal, a first electrostatic actuator portion overlying the support layer and a second electrostatic actuator portion overlying the support layer, wherein the piezoelectric actuator is coupled to the electrostatic actuator only at the contact shorting bar, and wherein the first conductor and the second conductor are aligned in a straight line along a first direction, and wherein the piezoelectric actuator and the electrostatic actuator are arranged in a manner that they are separated physically from each other both in the first direction and a second direction that is perpendicular to the first direction.

8. The device of claim 7, wherein the contact shorting bar is configured as a capacitor electrode, and wherein the piezoelectric actuator is coupled to the electrostatic actuator at the capacitor electrode.

9. The device of claim 7, wherein a layout of the first electrostatic actuator portion and a layout of the second electrostatic actuator portion are approximately symmetrical with respect to the contact shorting bar.

10. The device of claim 8, wherein a layout of the first electrostatic actuator portion and a layout of the second electrostatic actuator portion are approximately symmetrical with respect to the capacitor electrode.

11. The device of claim 7 further comprising a first voltage pad and a second voltage pad, wherein an actuation voltage is coupled to the piezoelectric actuator via the first voltage pad and the second voltage pad.

12. The device of claim 11, wherein the input signal received by the device is coupled to the output signal in response to the actuation voltage causing a movement of the piezoelectric actuator.

13. A device for coupling an input signal received via an input conductor to an output signal provided via an output conductor, comprising:
 a piezoelectric actuator comprising a first piezoelectric actuator portion and as second piezoelectric actuator portion, wherein the first piezoelectric actuator portion comprises a support layer, a first piezoelectric electrode overlying the support layer, a piezoelectric material layer overlying the first piezoelectric electrode layer, and a second piezoelectric electrode overlying the piezoelectric material layer, and wherein the second piezoelectric actuator portion comprises a support layer, a first piezoelectric portion, and a second piezoelectric portion, and wherein the first piezoelectric actuator portion and the second piezoelectric actuator portion are located at a peripheral location compared to a location of the input conductor and the output conductor; and an electrostatic actuator comprising a contact shorting bar formed over the support layer, wherein the contact shorting bar is coupled to receive the input signal, a first electrostatic actuator portion overlying the support layer and a second electrostatic actuator portion overlying the support layer, wherein the piezoelectric actuator is coupled to the electrostatic actuator at the contact shorting bar, and wherein the first electrostatic portion comprises a first electrode and a second electrode and the second electrostatic portion comprises a third electrode and a fourth electrode, and wherein each of the first electrode and the third electrode is coupled to a power supply voltage and wherein each of the second electrode and the fourth electrode is coupled to a ground voltage, and wherein the piezoelectric actuator and the electrostatic actuator are arranged in a manner that they are separated physically from each other both in a first direction and a second direction that is perpendicular to the first direction.

14. The device of claim 13, wherein the contact shorting bar is configured as a capacitor electrode, and wherein the piezoelectric actuator is coupled to the electrostatic actuator at the capacitor electrode.

15. The device of claim 13, wherein a layout of the first electrostatic actuator portion and a layout of the second electrostatic actuator portion are approximately symmetrical with respect to the contact shorting bar.

16. The device of claim 15, wherein a layout of the first electrostatic actuator portion and a layout of the second electrostatic actuator portion are approximately symmetrical with respect to the capacitor electrode.

17. The device of claim 13 further comprising a first voltage pad and a second voltage pad, wherein an actuation voltage is coupled to the piezoelectric actuator via the first voltage pad and the second voltage pad.

18. The device of claim 17, wherein the input signal received by the device is coupled to the output signal in response to the actuation voltage causing a movement of the piezoelectric actuator.

19. The device of claim 13, wherein a layout of the first piezoelectric actuator portion and a layout of the second piezoelectric actuator portion are approximately symmetrical with respect to the contact shorting bar.

20. The device of claim 14, wherein a layout of the first piezoelectric actuator portion and a layout of the second piezoelectric actuator portion are approximately symmetrical with respect to the capacitor electrode.

* * * * *